United States Patent
Royer et al.

(10) Patent No.: US 10,937,518 B2
(45) Date of Patent: Mar. 2, 2021

(54) MULTIPLE ALGORITHMIC PATTERN GENERATOR TESTING OF A MEMORY DEVICE

(71) Applicant: MICRON TECHNOLOGY, INC., Boise, ID (US)

(72) Inventors: Roman A. Royer, Boise, ID (US); Chikara Kondo, Tokyo (JP); Chiaki Dono, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 16/218,267

(22) Filed: Dec. 12, 2018

(65) Prior Publication Data
US 2020/0194090 A1    Jun. 18, 2020

(51) Int. Cl.
G11C 29/00    (2006.01)
G11C 29/36    (2006.01)
(Continued)

(52) U.S. Cl.
CPC .......... *G11C 29/36* (2013.01); *G06F 13/1663* (2013.01); *G11C 5/025* (2013.01);
(Continued)

(58) Field of Classification Search
CPC . G06F 13/1663; G11C 5/025; G11C 29/1201; G11C 29/26; G11C 29/44;
(Continued)

(56) References Cited

U.S. PATENT DOCUMENTS 6,907,555 B1    6/2005    Nomura et al.
7,057,948 B2    6/2006    Shimizu et al.
(Continued)

FOREIGN PATENT DOCUMENTS

KR    20070077520 A    7/2007
KR    20090070303 A    7/2009
WO    2017142897 A1    8/2017

OTHER PUBLICATIONS

U.S. Appl. No. 15/045,061, entitled: "Selectors on Interface Die for Memory Device", filed Feb. 16, 2016.
(Continued)

*Primary Examiner* — Guerrier Merant
(74) *Attorney, Agent, or Firm* — Dorsey & Whitney LLP

(57) ABSTRACT

Apparatuses including a test interface circuit that is configured to merge multiple independent traffic streams generated from individual algorithmic pattern generators (APGs) for communication with a memory device over a shared memory interface. The combination of multiple independent traffic streams, each with their own looping sequences and command timings, may generate a large set of random command sequences. The test interface circuit may include an arbiter circuit that merges a first independent traffic stream from a first APG and a second independent traffic stream from a second APG. Each of the first and second independent traffic streams are directed to different semi-independently-accessible portions of the memory device. The memory device may include a hybrid memory cube having independently accessible vaults or a high bandwidth memory device having independently accessible channels, in some examples. The test interface circuit may be included in a built-in self-test engine or in a standalone tester.

14 Claims, 7 Drawing Sheets

(51) Int. Cl.
- *G11C 29/12* (2006.01)
- *G11C 29/26* (2006.01)
- *G11C 5/02* (2006.01)
- *G06F 13/16* (2006.01)
- *G11C 29/44* (2006.01)
- *G11C 29/56* (2006.01)

(52) U.S. Cl.
CPC .......... *G11C 29/1201* (2013.01); *G11C 29/26* (2013.01); *G11C 29/44* (2013.01); *G11C 2029/3602* (2013.01); *G11C 2029/5602* (2013.01)

(58) Field of Classification Search
CPC .............. G11C 29/4401; G11C 7/1006; G11C 2029/0405; G11C 2029/0407; G11C 2029/0409; G11C 2029/1208; G01R 31/31917; G01R 31/31924; G01R 31/31928; G01R 31/31932
See application file for complete search history.

(56) References Cited

U.S. PATENT DOCUMENTS

| | | | |
|---|---|---|---|
| 7,400,134 B2 | 7/2008 | Morishita et al. | |
| 7,966,529 B2 | 6/2011 | Bakhshi et al. | |
| 9,881,693 B2 | 1/2018 | Kondo et al. | |
| 2002/0174382 A1 | 11/2002 | Ledford et al. | |
| 2002/0194558 A1 | 12/2002 | Wang et al. | |
| 2003/0065997 A1* | 4/2003 | Yamazaki | G11C 29/36 714/718 |
| 2005/0157565 A1 | 7/2005 | Lee | |
| 2005/0257109 A1 | 11/2005 | Averbuj et al. | |
| 2006/0184848 A1 | 8/2006 | Serizawa et al. | |
| 2007/0245200 A1* | 10/2007 | Hattori | G11C 29/028 714/742 |
| 2008/0059851 A1 | 3/2008 | Iizuka | |
| 2008/0082886 A1* | 4/2008 | Rasmussen | G01R 31/31917 714/738 |
| 2009/0063913 A1 | 3/2009 | Yamasaki et al. | |
| 2011/0087846 A1 | 4/2011 | Wang et al. | |
| 2011/0121294 A1* | 5/2011 | Koyama | G11C 29/1201 257/48 |
| 2012/0150478 A1* | 6/2012 | Song | G01R 31/31908 702/120 |
| 2015/0213860 A1 | 7/2015 | Narui et al. | |
| 2015/0262709 A1* | 9/2015 | Anzou | G11C 29/4401 365/189.07 |
| 2016/0011260 A1 | 1/2016 | Dervisoglu et al. | |
| 2017/0053711 A1* | 2/2017 | Shibata | G11C 29/12015 |
| 2017/0236597 A1* | 8/2017 | Kondo | G11C 29/1201 365/201 |
| 2018/0096734 A1 | 4/2018 | Kondo et al. | |

OTHER PUBLICATIONS

U.S. Appl. No. 15/833,425 entitled "Selectors on Interface Die for Memory Device", filed Dec. 6, 2017, pp. all.
"High-Bandwidth Memory (HBM)", Obtained from https://www.amd.com/Documents/High-Bandwidth-Memory-HBM.pdf on Feb. 16, 2016.
"International Search Report and Written Opinion for PCT App # PCT/US2017/017892, dated May 24, 2017".
"JEDEC Standard: High Bandwidth Memory (HBM) DRAM", JESD235; JEDEC Solid State Technology Association; Published Oct. 2013.
O'Connor, "Highlights of the High-Bandwidth Memory (HBM) Standard", NVIDIA; The Memory Forum; Jul. 14, 2014.
Tran, et al., "HBM: Memory Solution for High Performance Processors", SK Hynix Inc., Oct. 2014.
English translation of Notice of Final Rejection for KR Application No. 10-2018-7023169, dated Feb. 20, 2020.

* cited by examiner

MULTIPLE ALGORITHMIC PATTERN GENERATOR TESTING OF A MEMORY DEVICE

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking dice vertically and interconnecting the dice using through-silicon vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction.

In some implementations, the 3D memory devices may be used in end-customer systems that include many traffic sources in communication with the 3D memory device over a shared memory interface. For example, the 3D memory device may be used in multi-core processor systems, where each core is an independent traffic source. To verify reliable operation when installed in multi-core processor systems, the 3D memory devices it may be desirable to test the 3D memory device in a way that emulates a multi-core processor system. Some approaches that are used to replicating multi-core processor traffic in order to test the 3D memory devices are to use software to generate pseudo-random traffic streams, which are then executed on a vector-based test platform. However, this approach may be limited as writing and maintaining the traffic generation software can be very complicated and time consuming and invalid patterns may be generated due to software bugs.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
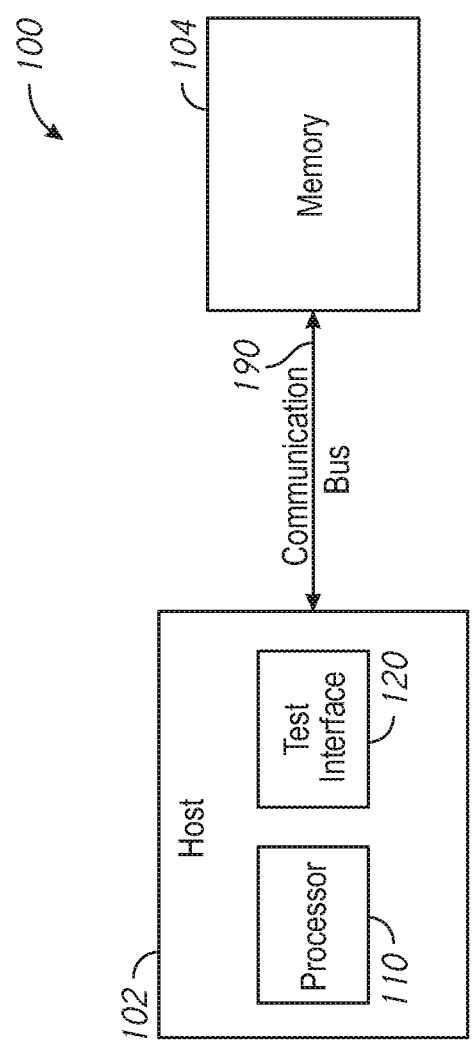
FIG. 1 is a block diagram of a computing system that includes a host and a memory device in accordance with some embodiments of the disclosure.

FIG. 1 is a block diagram of a computing system 100 that includes a host 102 and a memory device 104 in accordance with some embodiments of the disclosure. The host 102 may communicate with the memory device 104 via a communication bus 190. The host 102 may include one or more processors (processor(s)) 110 and a test interface circuit 120. The processor(s) 110 may include a multi-core processor with multiple cores each configured to communicate with the memory device 104 with an independent traffic stream. To test operation of the memory device 104, the test interface circuit 120 may be configured to generate multiple, independent traffic streams using multiple algorithmic pattern generators (APGs) and combine the multiple, independent traffic streams for communication over the communication bus 190.

The memory device 104 may be capable of parallel communication with one or more cores of the processor(s) 110, in some examples. The memory device 104 may include a 3D memory device. Example 3D memory devices may include a hybrid memory cube (HMC) or a high bandwidth memory (HBM). An HMC may include a third dimension by stacking memory die on top of one another and interconnecting the stacked memory die using through-silicon via (TSV) structures that provide access on both a top and a bottom of a respective memory die to enable interconnection of multiple memory die layers in order to construct the HMC. The memory die may include dynamic random-access memory (DRAM) die. This ability of interconnecting multiple die layers permits building the memory device 104 with a combination of memory storage layers and one or more logic layers. In this manner, the HMC may provide physical memory storage and logical memory transaction processing in a single package. An HMC may provide a compact and power efficient package having a high bandwidth capacity. In order to achieve high bandwidth, the HMC includes a combination of a hierarchical approach and a parallel approach. The HMC hierarchy is implemented vertically across the logic layers and the parallelism occurs across a given die layer. Thus, topographically, a surface of an individual layer of an HMC may be divided into a two-dimensional grid. Each grid section may be grouped with vertically aligned grid sections of the other memory layers of the HMC to form a vault (e.g., or column). Thus, a value is a grid section vertically spanning the memory layers of the HMC (e.g., within the memory die using the TSVs). Each of the vaults may be accessed independently and in parallel with one another. In some examples, an HMC may be divided into 16 vaults, each having a respective logic base layer.

HBM may include a high-performance random access memory interface and vertically stacked DRAM die. In some examples, the HBM may include four DRAM die and eight input/output (I/O) channels each having 128 bits for total width of host 1024 bits. The HBM may further include an interface (I/F) die that is configured to provide an interface with the eight input/output channels. The I/O channels may each be capable of functioning independently of one another. For example, a clock frequency, a command sequence, and data may be independently provided for each channel. Other implementations of the HBM may include more or fewer than four DRAM die, more or fewer than 8 independent I/O channels, and each I/O channel may have a width that is greater than or less than 128 bits without departing from the scope of the disclosure.

In operation, the host 102 may be configured to communicate with the memory device 104 via the communication bus 190. The communication bus 190 may include a bus capable of providing command, address, clock signals, data, etc., to the memory device 104 from the host 102 and receiving address, clock signals, data, etc., at the host 102 from the memory device 104. The type of bus implemented with the communication bus 190 may be based on the architecture of the memory device 104. For example, if the memory device 104 includes a HMC, the communication bus 190 may include a HMC link bus. If the memory device 104 include a HBM, the communication bus 190 may include command, address, data, and data strobe signal lines.

During a test operation, the test interface circuit 120 may be configured to generate multiple, independent traffic streams. Each independent traffic stream may be generated by a respective APG. The multiple, independent traffic streams may each be directed to a different portion of the memory device 104. Each APG may be programmed with independent data/command/address patterns, looping sequences, and command timings. The outputs of the APGs may be provided to an arbiter circuit that is configured to merge information from the multiple, independent traffic streams to provide the multiple, and independent traffic streams to the memory device 104 via the communication bus 190 in accordance with a specified communication architecture. Generation of the multiple, independent traffic streams may emulate multiple cores of the processor(s) 110 each independently executing different processing threads, in some examples. The arbiter circuit may include decoder circuits that are each configured to decode a respective one of the multiple, independent traffic streams and to provide first control signals to a selector circuit and second control signals to APGs associated with the other multiple, independent traffic streams. The arbiter circuit may further include a multiplexer that is configured to selectively couple a bus associated with one of the APGs to the shared interface based on a third control signal from a selector circuit The selector circuit may provide the third control circuit having a value based on the respective first control signals.

In an embodiment where the memory device 104 is a HMC, two or more individual APGs of the test interface circuit 120 may each generate independent traffic streams that are each directed to a different respective vault of the HMC. For example, each APG may generate request packets that include independently generated command and address sequences and/or data sequences and provide the request packets to an arbiter of the test interface circuit 120. Each APG may also receive response packets that include data from a respective vault of the memory device 104. In some examples, the APGs may include comparators to compare received data with expected receive data. The result of the comparison may be used to detect errors, as well as to inform a next command and address sequence. To prevent packet collisions or clobbering, the arbiter may control provision of the respective request packets from the APGs to the HMC via the communication bus 190 and control provision of the respective response packets from the HMC via the communication bus 190 to the corresponding APG based on a vault from which the response packet was received. The arbiter may use a predefined pattern or order for APG request packet transmission via the communication bus 190. For example, the arbiter may use a round-robin pattern to sequentially cycle through the APGs to provide corresponding request packets, and return to the first APG to start the process again. Some HMC requests are specified to be split into two separate packets. The arbiter may include logic to allow consecutive request packet transmissions from an APG prior to moving to a next APG request packet transmission when an HMC request is split across two separate packets.

In an embodiment where the memory device 104 is a HBM, two or more individual APGs of the test interface circuit 120 may each generate independent traffic streams that are each directed to a different respective pseudo-channels of the HBM. For example, each APG may generate write data signaling (e.g., write data and write data strobe signals) and command/address signaling (e.g., a clock signal, a clock enable signal, and/or row and column address/command signals). The command/address signaling may be provided to an arbiter of the test interface circuit 120. The write data signaling may be provided directly to a corresponding pseudo-channel of the memory device 104. Each APG may further receive read data signaling (e.g., read data and/or read data strobe signals). In the HBM implementation, the communication bus 190 includes independent signal lines for each I/O pseudo-channel for data transmission, such as independent DQ lines for the data, WDQS signal lines for write data strobe signals, and RDQS signal lines for read data strobe signals. However, the command/address signaling for each I/O channel (e.g., both pseudo-channels) is shared using common signal lines on the communication bus 190, such as CLK signal lines for a clock signal, a CKE signal line for a clock enable signal, and row and column command/address signal lines for row and column command/address signals. To prevent packet collisions or clobbering, the arbiter may control provision of the row and column command/address signals from the APGs to the HBM via the communication bus 190. The DQ lines, WDQS signal lines, and RDQS signal lines of the communication bus 190 that correspond to a particular I/O pseudo-channel may be coupled directly to the associated APG. The arbiter may use a predefined pattern or order for APG command/address signal transmission via the communication bus 190. For example, the arbiter may use a round-robin pattern to sequentially cycle through the APGs to provide corresponding command/address signals, and return to the first APG to start the process again. In some examples, an HBM command/address signal transmission may be split and transmitted across two consecutive clock cycles, such as in situations where an activate command is transmitted. The arbiter may include logic to allow consecutive command/address signal transmissions from a single APG prior to moving to a next APG command/address signal transmission.

The test interface circuit 120 that includes multiple APGs to generate multiple, independent traffic streams to emulate different traffic streams from multiple cores of a processor (e.g., the processor(s) 110) and an arbiter to merge the multiple, independent traffic streams for communication with the memory device 104 may provide more robust and simplified test platform for testing the memory device 104 as compared with software solutions that are time-consuming, complex, and error-prone. That is, because each APG is independent, simple data/command/address patterns may be written within each APG, combining the multiple, independent traffic streams, each with their own looping sequences and command timings, may result in walking of the multiple, independent traffic streams past each other and generate a large set of random command sequences without having to program complex patterns. In some examples, the host 102 may be part of a computing system. In other examples, the host 102 may be an external tester that includes the test interface circuit 120, or the test interface circuit 120 may be included in a standalone, external test circuit or test application-specific integrated circuit (ASIC). Further, while FIG. 1 depicts that the test interface circuit 120 is included within the host 102, such as part of a built-in self-test (BIST) engine of the host 102, the test interface circuit 120 may alternatively be part of a BIST engine of the memory device 104 without departing from the scope of the disclosure.

Figure 2:
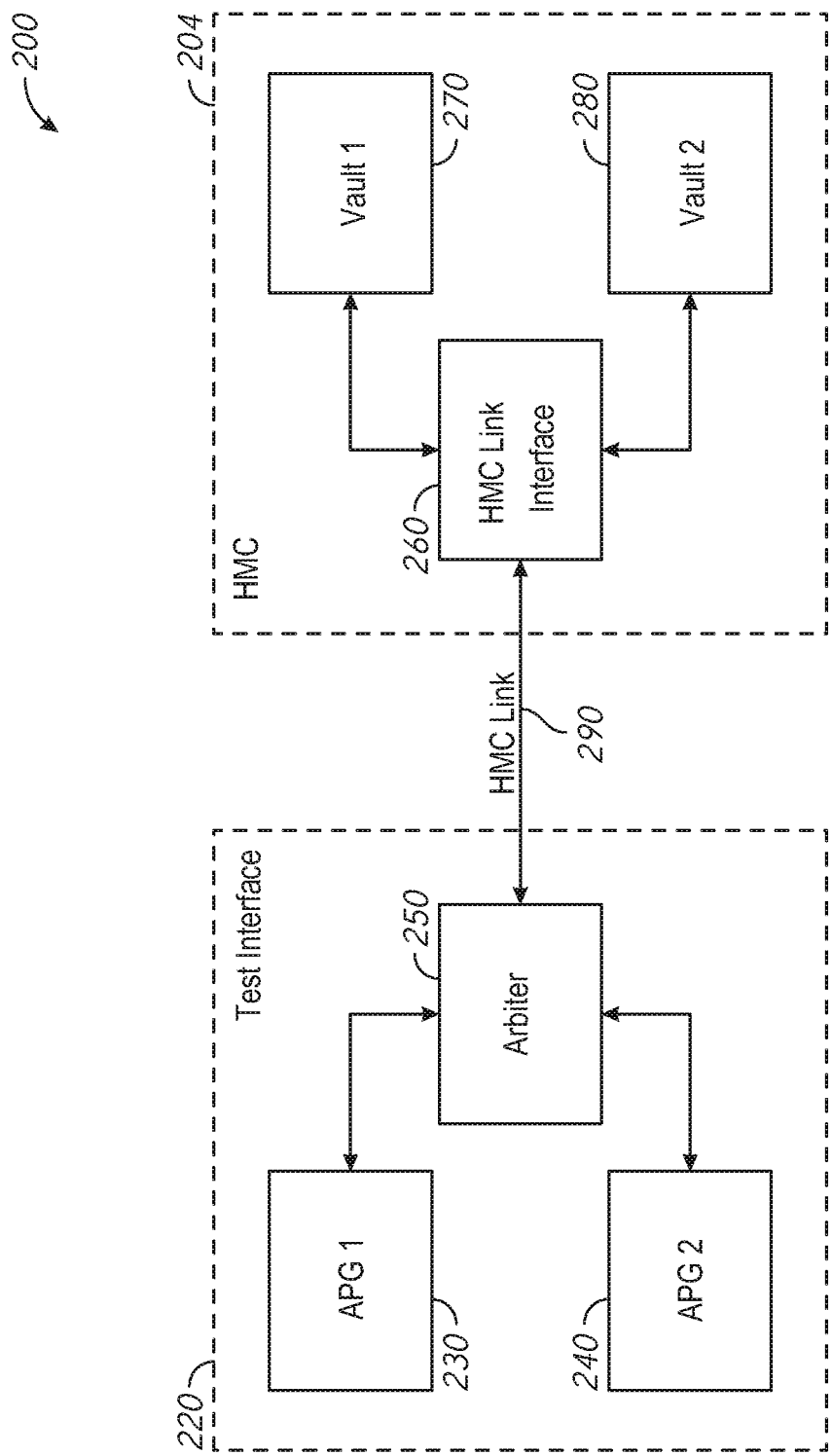
FIG. 2 is a block diagram of a computing system that includes a test interface circuit and a memory device in accordance with some embodiments of the disclosure.

FIG. 2 is a block diagram of a computing system 200 that includes a test interface circuit 220 and a memory device 204 in accordance with some embodiments of the disclosure. The system 200 may be implemented in the system 100 of FIG. 1. In some examples, the test interface circuit 220 may be implemented in the test interface circuit 120 of FIG. 1. In some examples, the memory device 204 may be implemented in the memory device 104 of FIG. 1.

The test interface circuit 220 may communicate with the memory device 204 via a HMC link 290. The test interface circuit 220 may include a first APG 230, a second APG 240, and an arbiter circuit 250. To test operation of the memory device 204, the test interface circuit 220 may be configured to generate multiple, independent traffic streams using the first APG 230 and the second APG 240, and combine the multiple, independent traffic streams via the arbiter circuit 250 for communication over the HMC link 290. The first APG 230 may be configured to provide request packets to and receive response packets from the arbiter circuit 250 as a first independent traffic stream. In some examples, the request packets and the response packets from the first APG 230 may correspond to communication with first vault 270 of the memory device 204. The second APG 240 may be configured to provide request packets to and receive response packets from the arbiter circuit 250 as a second independent traffic stream. In some examples, the request packets and the response packets from the second APG 240 may correspond to communication with second vault 280 of the memory device 204.

The memory device 204 may include an HMC link interface 260, the first vault 270, and the second vault 280. The HMC link interface 260 may enable parallel communication among the first vault 270 and the second vault 280 via the HMC link 290. The memory device 204 may include multiple stacked memory die that are interconnected using TSV structures. The memory die may include dynamic random-access memory (DRAM) die. The memory device 204 may include a combination of a hierarchical approach and a parallel approach. The memory device 204 hierarchy may be implemented vertically across the logic layers and the HMC parallelism occurs across a given die layer. Thus, topographically, a surface of an individual layer of the memory device 204 may be divided into a two-dimensional grid. Each grid section may be grouped with vertically aligned grid sections of the other memory layers of the HMC to form a vault (e.g., or column). The memory device 204 is shown having the first vault 270 and the second vault 280. More vaults may be included in the memory device 204 without departing from the scope of the disclosure. Each of vaults, including the first vault 270 and the second vault 280, may be accessed independently and in parallel with one another. In some examples, an HMC may be divided into 16 vaults.

During a test operation, the test interface circuit 220 may be configured to generate two independent traffic streams via the first APG 230 and the second APG 240. Each of the first APG 230 and the second APG 240 may be programmed with independent data/command/address patterns, looping sequences, and command timings. The outputs of the first APG 230 and the second APG 240 may be provided to the arbiter circuit 250. The arbiter circuit 250 may be configured to merge information from the first APG 230 and the second APG 240 to provide the multiple, independent traffic streams to the memory device 204 via the HMC link 290 in accordance with a specified communication architecture. Generation of the multiple, independent traffic streams provided by the first APG 230 and the second APG 240 may emulate multiple cores of the processor(s) 110 each independently executing different processing threads, in some examples.

The first APG 230 and the second APG 240 may each generate independent traffic streams that are directed to a different respective vault of the memory device 204. For example, the first APG 230 may generate request packets that include independently generated command and address sequences and/or data sequences directed to the first vault 270 and provide the request packets to the arbiter circuit 250. Similarly, the second APG 240 may generate request packets that include independently generated command and address sequences and/or data sequences directed to the second vault 280 and provide the request packets to the arbiter circuit 250 Each of the first APG 230 and the second APG 240 may also receive response packets that include data from the first vault 270 and the second vault 280, respectively, of the memory device 204. In some examples, the first APG 230 and the second APG 240 may include comparators to compare received data with expected receive data. The result of the comparison may be used to detect errors, as well as to inform a next command and address sequence. To prevent packet collisions or clobbering, the arbiter circuit 250 may control provision of the respective request packets from the first APG 230 and the second APG 240 to the memory device 204 via the HMC link 290 and control provision of the respective response packets from the first vault 270 and the second vault 280 of the memory device 204 via the HMC link 290 to the corresponding one of the first APG 230 and the second APG 240, respectively. The arbiter circuit 250 may use a predefined pattern or order for request packet transmissions from the first APG 230 and the second APG 240. For example, the arbiter circuit 250 may use a round-robin pattern to alternate between the first APG 230 and the second APG 240 to provide corresponding request packets. Some HMC requests are specified to be split into two separate packets. The arbiter circuit 250 may include logic to allow consecutive request packet transmissions from one of the first APG 230 or the second APG 240, in some examples. The HMC link interface 260 may receive the request packets from the arbiter circuit 250 via the HMC link 290, and may directed them to a target one of the first vault 270 or the second vault 280. The HMC link interface 260 may also receive the response packets from the first vault 270 and the second vault 280 and may provide the response packets to the arbiter circuit 250 via the HMC link 290.

The test interface circuit 220 that includes the first APG 230 and the second APG 240 configured to generate two independent traffic streams to emulate different traffic streams from separate cores of a processor (e.g., the processor(s) 110 of FIG. 1) and the arbiter circuit 250 configured to merge the multiple, independent traffic streams for communication with the memory device 204 may provide more robust and simplified test platform for testing the memory device 204 as compared with software solutions that are time-consuming, complex, and error-prone. That is, because the first APG 230 and the second APG 240 are independent, simple data/command/address patterns may be written within each of the first APG 230 and the second APG 240, combining the multiple, independent traffic streams, each with their own looping sequences and command timings, may result in walking of the multiple, independent traffic streams past each other and generate a large set of random command sequences without having to program complex patterns. In some examples, the test interface circuit 220 may be part of built-in self-test (BIST) engine. In other examples, the test interface circuit 220 may be implemented in a standalone, external test circuit. Further, while FIG. 2 depicts that the test interface circuit 220 is external to the memory device 204, the test interface circuit 220 may alternatively be part of a BIST engine included in the memory device 204 without departing from the scope of the disclosure.

Figure 3:
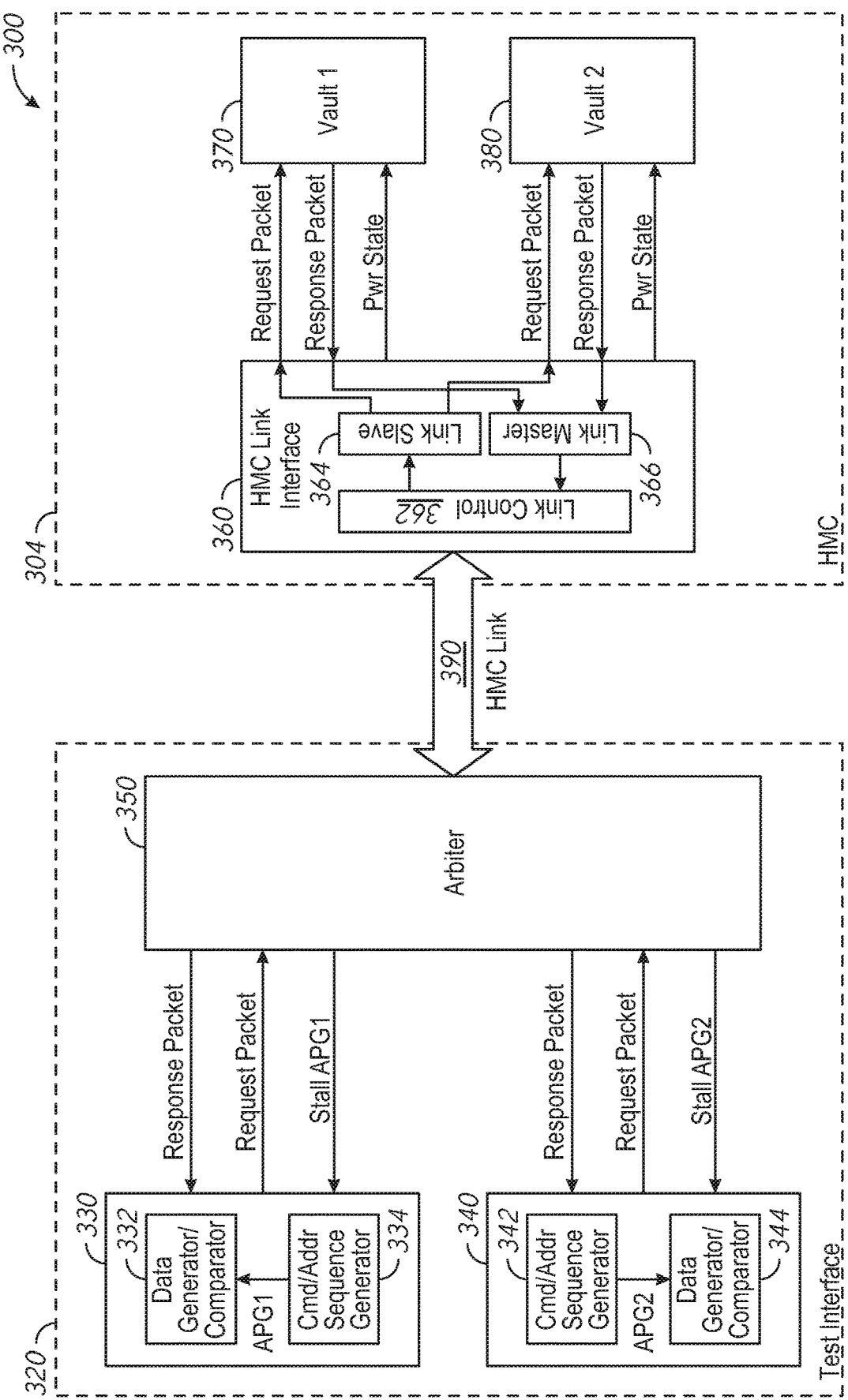
FIG. 3 is a block diagram of a computing system that includes a test interface circuit and a memory device in accordance with some embodiments of the disclosure.

FIG. 3 is a block diagram of a computing system 300 that includes a test interface circuit 320 and a memory device 304 in accordance with some embodiments of the disclosure. The system 300 may be implemented in the system 100 of FIG. 1 and/or the system 200 of FIG. 2. In some examples, the test interface circuit 320 may be implemented in the test interface circuit 120 of FIG. 1 and/or the test interface circuit 220 of FIG. 2. In some examples, the memory device 304 may be implemented in the memory device 104 of FIG. 1 and/or the memory device 204 of FIG. 2.

The test interface circuit 320 may communicate with the memory device 304 via a HMC link 390. The test interface circuit 320 may include a first APG 330, a second APG 340, and an arbiter circuit 350. To test operation of the memory device 304, the test interface circuit 320 may be configured to generate multiple, independent traffic streams using the first APG 330 and the second APG 340, and combine the multiple, independent traffic streams via the arbiter circuit 350 for communication over the HMC link 390. The first APG 330 may be configured to provide request packets to and receive response packets from the arbiter circuit 350 as a first independent traffic stream. In some examples, the request packets and the response packets from the first APG 330 may correspond to communication with first vault 370 of the memory device 304 The first APG 330 may include a data generator/comparator 332 that is configured to generate data to provide in the request packets and to compare data received via response packets with expected data. The first APG 330 may further include a command/address generator 334 that is configured to generate command and address sequences for the request packets. The second APG 340 may be configured to provide request packets to and receive response packets from the arbiter circuit 350 as a second independent traffic stream. In some examples, the request packets and the response packets from the second APG 340 may correspond to communication with second vault 380 of the memory device 304. The second APG 340 may include a data generator/comparator 342 that is configured to generate data to provide in the request packets and to compare data received via response packets with expected data. The second APG 340 may further include a command/address generator 344 that is configured to generate command and address sequences for the request packets. The arbiter circuit 350 may be configured to route request and response packets between the memory device 304 and the first APG 330 and the second APG 340. In some examples, the arbiter circuit 350 may also provide a first stall signal Stall APG1 to the first APG 330 when consecutive packets are to be transmitted from the second APG 340. Similarly, the arbiter circuit 350 may also provide a second stall signal Stall APG2 to the second APG 340 when consecutive packets are to be transmitted from the first APG 330. While the Stall AGP1 signal is set, the first APG 330 may pause provision of respective request packets. While the Stall AGP2 signal is set, the second APG 340 may pause provision of respective request packets.

The memory device 304 may include an HMC link interface 360, the first vault 370, and the second vault 380. The HMC link interface 360 may enable parallel communication among the first vault 370 and the second vault 380 via the HMC link 390. The HMC link interface 360 may include a link control 362, a link slave 364, and a link master 366. The link control 362 is configured to provide the response packets to the HMC link 390 and to receive the request packets from the HMC link 390. The link slave 364 is configured to route respective request packets to the first vault 370 and the second vault 380. The link master 366 is configured to receive respective response packets from the first vault 370 and the second vault 380. The memory device 304 may include multiple stacked memory die that are interconnected using TSV structures. The memory die may include dynamic random-access memory (DRAM) die. The memory device 304 may include a combination of a hierarchical approach and a parallel approach. The memory device 304 hierarchy may be implemented vertically across the logic layers and the HMC parallelism occurs across a given die layer. Thus, topographically, a surface of an individual layer of the memory device 304 may be divided into a two-dimensional grid. Each grid section may be grouped with vertically aligned grid sections of the other memory layers of the HMC to form a vault (e.g., or column). The memory device 304 is shown having the first vault 370 and the second vault 380. More vaults may be included in the memory device 304 without departing from the scope of the disclosure. Each of vaults, including the first vault 370 and the second vault 380, may be accessed independently and in parallel with one another. In some examples, an HMC may be divided into 16 vaults, each having a respective logic base layer. In some examples, the HMC link interface 360 may be further figured to provide respective power state signals Pwr State to the first vault 370 and the second vault 380 to control respective operational modes of the first vault 370 or second vault 380.

During a test operation, the test interface circuit 320 may be configured to generate two independent traffic streams via the first APG 330 and the second APG 340. Each of the first APG 330 and the second APG 340 may be programmed with independent data/command/address patterns, looping sequences, and command timings. The outputs of the first APG 330 and the second APG 340 may be provided to the arbiter circuit 350. The arbiter circuit 350 may be configured to merge information from the first APG 330 and the second APG 340 to provide the multiple, independent traffic streams to the memory device 304 via the HMC link 390 in accordance with a specified communication architecture. Generation of the multiple, independent traffic streams provided by the first APG 330 and the second APG 340 may emulate multiple cores of the processor(s) 110 each independently executing different processing threads, in some examples.

The first APG 330 and the second APG 340 may each generate independent traffic streams that are directed to a different respective vault of the memory device 304. For example, the first APG 330 may generate request packets that include independently generated command and address sequences via the command/address generator 334 and/or data sequences via the data generator/comparator 332 that are directed to the first vault 370 and provide the request packets to the arbiter circuit 350. Similarly, the second APG 340 may generate request packets that include independently generated command and address sequences via the command/address generator 344 and/or data sequences via the data generator/comparator 342 directed to the second vault 380 and provide the request packets to the arbiter circuit 350. Each of the first APG 330 and the second APG 340 may also receive response packets that include data from the first vault 370 and the second vault 380, respectively, of the memory device 304 In some examples, the data generator/comparator 332 and the data generator/comparator 342 may include comparators to compare received data with expected receive data. The result of the comparison may be used to detect errors, as well as to inform a next command and address sequence. To prevent packet collisions or clobbering, the arbiter circuit 350 may control provision of the respective request packets from the first APG 330 and the second APG 340 to the memory device 304 via the HMC link 390 and control provision of the respective response packets from the first vault 370 and the second vault 380 of the memory device 304 via the HMC link 390 to the corresponding one of the first APG 330 and the second APG 340, respectively. The arbiter circuit 350 may use a predefined pattern or order for request packet transmissions from the first APG 330 and the second APG 340. For example, the arbiter circuit 350 may use a round-robin pattern to alternate between the first APG 330 and the second APG 340 to provide corresponding request packets. Some HMC requests are specified to be split into two separate packets. The arbiter circuit 350 may include logic to allow consecutive request packet transmissions from one of the first APG 330 or the second APG 340, in some examples. Thus, the arbiter circuit 350 may provide the Stall APG2 signal to the second APG 340 when the first APG 330 is providing consecutive packets and provide a Stall APG1 signal to the first APG 330 when the second APG 340 is providing consecutive packets. While the Stall AGP1 signal is set, the first APG 330 may pause provision of respective request packets. While the Stall AGP2 signal is set, the second APG 340 may pause provision of respective request packets.

The link control 362 may receive the request packets from the arbiter circuit 350 via the HMC link 390 and may provide the request packets to the link slave 364. The link slave 364 may route the request packets to a target one of the first vault 370 or the second vault 380. The link master 366 may also receive the response packets from the first vault 370 and the second vault 380 and may provide the response packets to the link control 362. The link control 362 may provide the response packets to the arbiter circuit 350 via the HMC link 390.

The test interface circuit 320 that includes the first APG 330 and the second APG 340 configured to generate two independent traffic streams to emulate different traffic streams from separate cores of a processor (e.g., the processor(s) 110 of FIG. 1) and the arbiter circuit 350 configured to merge the multiple, independent traffic streams for communication with the memory device 304 may provide more robust and simplified test platform for testing the memory device 304 as compared with software solutions that are time-consuming, complex, and error-prone. That is, because the first APG 330 and the second APG 340 are independent, simple data/command/address patterns may be written within each of the first APG 330 and the second APG 340, combining the multiple, independent traffic streams, each with their own looping sequences and command timings, may result in walking of the multiple, independent traffic streams past each other and generate a large set of random command sequences without having to program complex patterns. In some examples, the test interface circuit 320 may be part of built-in self-test (BIST) engine. In other examples, the test interface circuit 320 may be implemented in a standalone, external test circuit. Further, while FIG. 3 depicts that the test interface circuit 320 is external to the memory device 304, the test interface circuit 320 may alternatively be part of a BIST engine included in the memory device 304 without departing from the scope of the disclosure.

Figure 4:
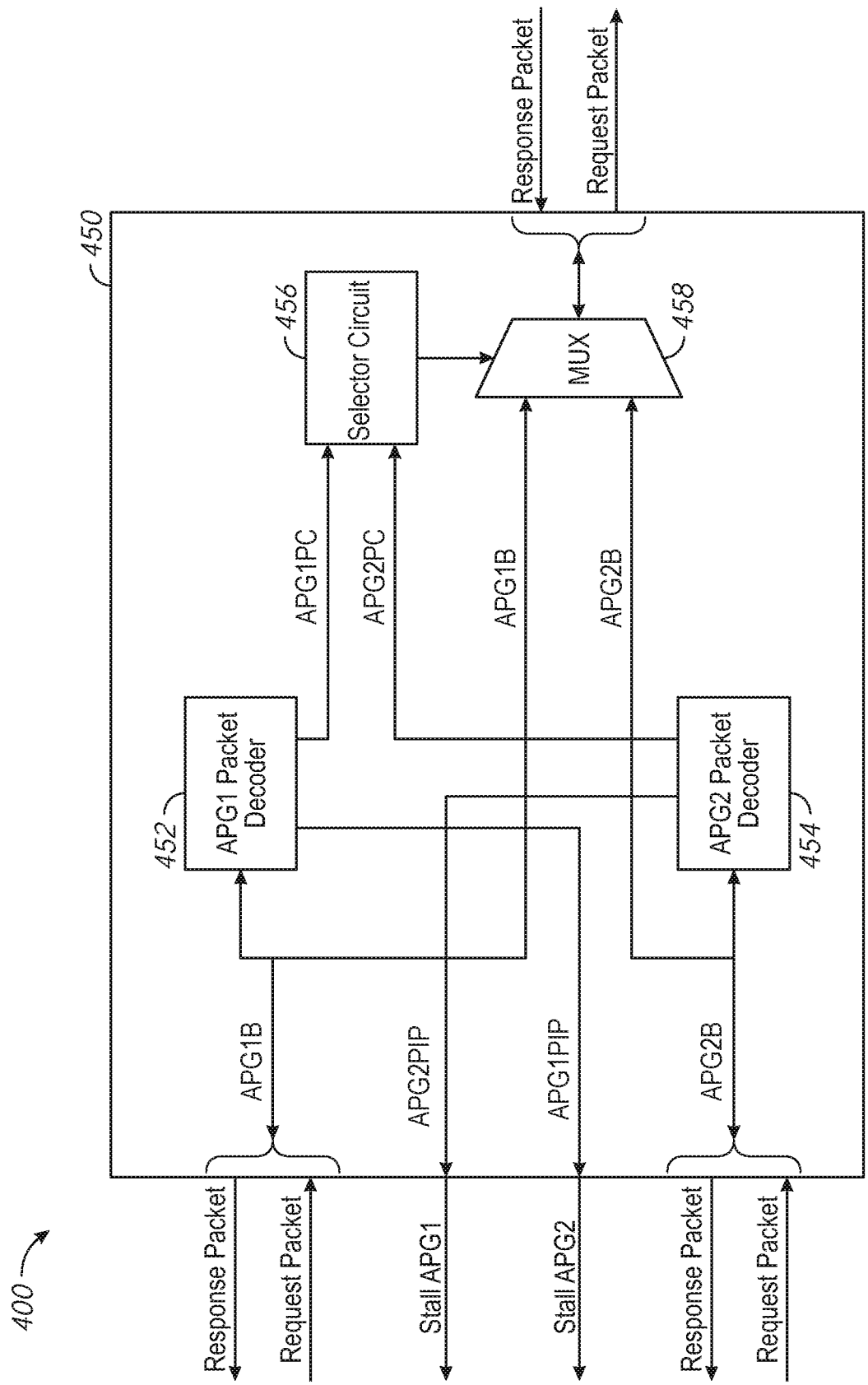
FIG. 4 is a block diagram of a computing system that includes an arbiter circuit in accordance with some embodiments of the disclosure.

FIG. 4 is a block diagram of a computing system 400 that includes an arbiter circuit 450 in accordance with some embodiments of the disclosure. The arbiter circuit 450 may be implemented in the test interface circuit 120 of FIG. 1, the arbiter circuit 250 of FIG. 2, and/or the arbiter circuit 350 of FIG. 3. The arbiter circuit 450 may be configured to communicate with a first and a second APG (e.g., the first APG 230 and the second APG 240 of FIG. 2 or the first APG 330 and the second APG 340 of FIG. 3) and with a HMC via a communication bus (e.g., the HMC link 290 of FIG. 2 or the HMC link 390 of FIG. 3.

The arbiter circuit 450 may include a first APG packet decoder 452, a second APG packet decoder 454, a selector circuit 456, and a multiplexer 458. The first APG packet decoder 452 may be configured to receive request packets from a first APG via a first APG bus AGP1B. The first APG packet decoder 452 may decode the request packets to provide an APG1 packet complete signal APG1PC to the selector circuit 456 and an APG1 packet in process signal APG1PIP to the selector circuit 456. The values of the APG1PC signal and the APG1PIP signal may be based on data from the decoded request packet. The first APG packet decoder 452 may set the APG1PC signal in response to completion of provision of a request packet. The first APG packet decoder 452 may set the APG1PIP signal while a packet is being transmitted on the APG1B bus. In some examples, some HMC requests are specified to be split into two separate packets. Thus, the first APG packet decoder 452 may hold the APG1PC signal at a cleared value and the APG1PIP signal to a set value when consecutive request packets are to be transmitted from the first APG. The APG1PIP may be provided to the second APG as the Stall AGP2 signal. In response to the Stall APG2 signal being set, the second APG may pause provision of respective request packets.

The second APG packet decoder 454 may be configured to receive request packets from a second APG via a first APG bus AGP2B. The second APG packet decoder 454 may decode the request packets to provide an APG2 packet complete signal APG2PC to the selector circuit 456 and an APG2 packet in process signal APG2PIP to the selector circuit 456. The second APG packet decoder 454 may set the APG2PC signal in response to completion of provision of a request packet. The second APG packet decoder 454 may set the APG2PIP signal while a packet is being transmitted on the APG2B bus. In some examples, some requests are specified to be split into two separate packets. Thus, the second APG packet decoder 454 may hold the APG2PC signal at a cleared value and the APG2PIP signal at a set value when consecutive request packets are to be transmitted from the second APG. The APG2PIP may be provided to the first APG as the Stall AGP1 signal. In response to the Stall APG1 signal being set, the first APG may pause provision of respective request packets.

The multiplexer 458 may be configured to receive the request packets from the APG1B bus and from the APG2B bus. The selector circuit 456 may control the multiplexer 458 to couple one of the APG1B or the APG2B to the HMC link bus based on the APG1PC and APG2PC signals. For example, the selector circuit 456 may transition from selection of the APG2B bus to selection of the APG1B bus in response the APG2PC signal being set. The selector circuit 456 may transition from selection of the APG1B bus to selection of the APG2B bus in response the APG1PC signal being set.

When the APG1B bus is selected, the multiplexer 458 may be configured to provide request packets to the HMC link bus from the APG1B bus and/or to provide response packets to the APG1B bus from the HMC link bus. When the APG2B bus is selected, the multiplexer 458 may be configured to provide request packets to the HMC link bus from the APG2B bus and/or to provide response packets to the APG2B bus from the HMC link bus.

Figure 5:
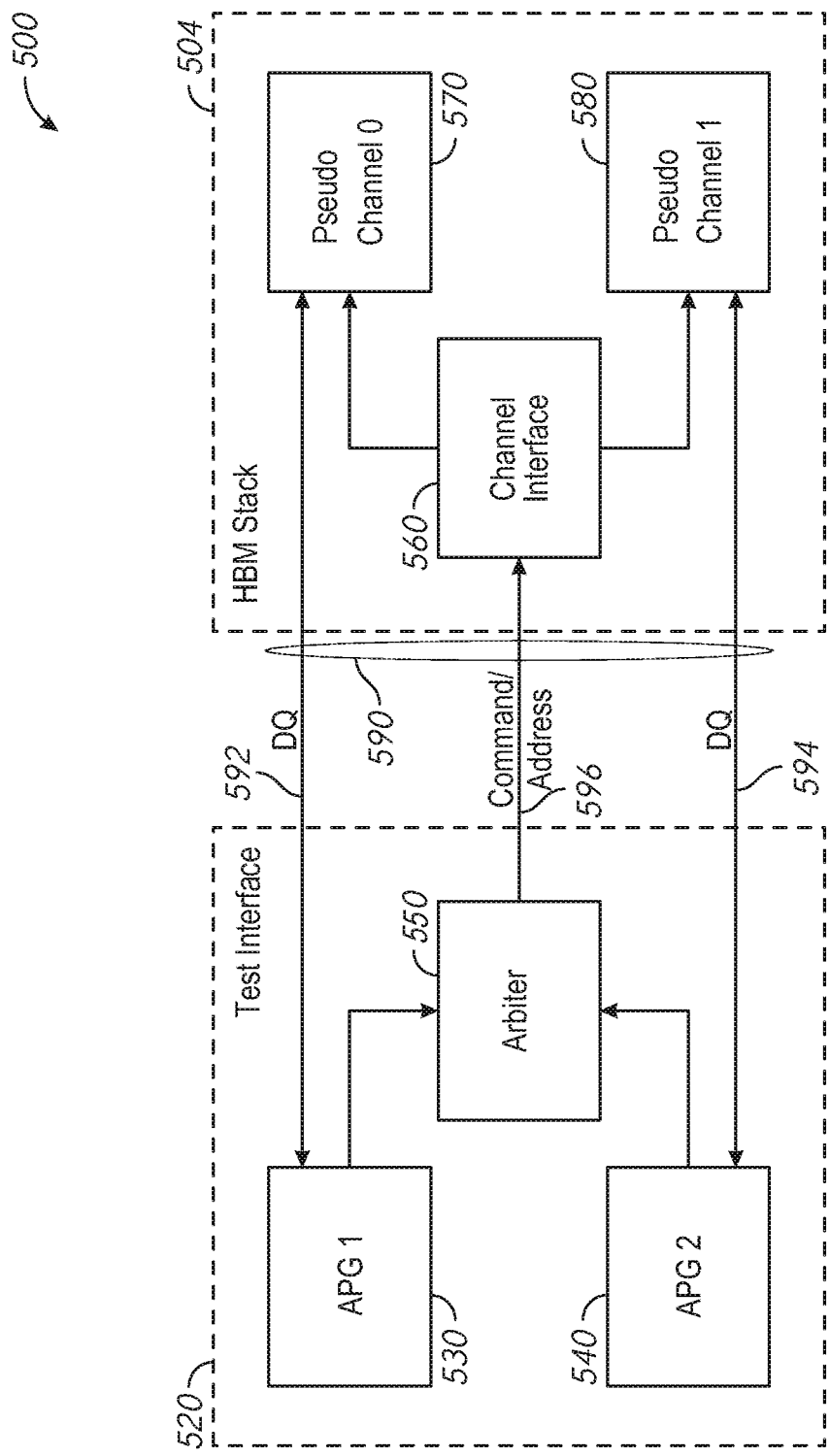
FIG. 5 is a block diagram of a computing system that includes a test interface circuit and a memory device in accordance with some embodiments of the disclosure.

FIG. 5 is a block diagram of a computing system 500 that includes a test interface circuit 520 and a memory device 504 in accordance with some embodiments of the disclosure. The system 500 may be implemented in the system 100 of FIG. 1. In some examples, the test interface circuit 520 may be implemented in the test interface circuit 120 of FIG. 1. In some examples, the memory device 504 may be implemented in the memory device 104 of FIG. 1.

The test interface circuit 520 may communicate with the memory device 504 via a communication bus 590. The test interface circuit 520 may include a first APG 530, a second APG 540, and an arbiter circuit 550. To test operation of the memory device 504, the test interface circuit 520 may be configured to generate multiple, independent traffic streams using the first APG 530 and the second APG 540. The first APG 530 may be configured to provide data to the memory device 504 via a data bus 592 of the communication bus 590. The second APG 540 may be configured to provide data to the memory device 504 via a data bus 594 of the communication bus 590. The first APG 530 and the second APG 540 may be configured to provide respective command and address data to the arbiter circuit 550, which may be configured to arbitrate provision of the respective command and address data for communication over a command/address bus 596 of the communication bus 590. The first APG 530 may be configured to provide respective command and address data to the arbiter circuit 550 and write data to the memory device 504 and to receive read data from the memory device 504 as a first independent traffic stream. In some examples, the command and address data and the write/read data associated with the first APG 530 may correspond to communication with first pseudo-channel 570 of the memory device 504. The second APG 540 may be configured to provide respective command and address data to the arbiter circuit 550 and write data to the memory device 504 and to receive read data from the memory device 504 as a second independent traffic stream. In some examples, the command and address data and the write/read data associated with the second APG 540 may correspond to communication with second pseudo-channel 580 of the memory device 504. In some examples, the arbiter circuit 550 may also provide a first stall signal Stall APG1 to the first APG 530 when consecutive command/address signals are to be transmitted from the second APG 540. Similarly, the arbiter circuit 550 may also provide a second stall signal Stall APG2 to the second APG 540 when consecutive command/address signals are to be transmitted from the first APG 530. While the Stall AGP1 signal is set, the first APG 530 may pause provision of respective command/address signals. While the Stall AGP2 signal is set, the second APG 540 may pause provision of respective command/address signals.

The memory device 504 may include a high-performance random access memory interface and vertically stacked DRAM die. In some examples, the HBM may include multiple (e.g., 4, 8, 16, etc.) DRAM die and multiple (e.g., 4, 8, 16, etc.) pseudo-channels, including the first pseudo-channel 570 and the second pseudo-channel 580, each having multiple (e.g., 32, 64, 128, 256, etc.) I/Os. The memory device 504 may further include an interface (I/F) die having a channel interface circuit 560 that is configured to provide an interface with the multiple input/output channels, including the first pseudo-channel 570 and the second pseudo-channel 580. The first pseudo-channel 570 and the second pseudo-channel 580 may each be capable of functioning semi-independently (e.g., sharing the command/address bus 596) of one another. For example, a command sequence, and data may be independently provided for each of the first pseudo-channel 570 and the second pseudo-channel 580.

During a test operation, the test interface circuit 520 may be configured to generate two independent traffic streams via the first APG 530 and the second APG 540. Each of the first APG 530 and the second APG 540 may be programmed with independent data/command/address patterns, looping sequences, and command timings. The outputs of the first APG 530 and the second APG 540 may be provided to the data bus 592, the data bus 594, and the arbiter circuit 550, respectively. The arbiter circuit 550 may be configured to merge command and address information from the first APG 530 and the second APG 540 to provide the respective command and address data to the memory device 504 via the command/address bus 596 in accordance with a specified communication architecture. Generation of the multiple, independent traffic streams may emulate multiple cores of a processor each independently executing different processing threads, in some examples. The first APG 530 and the second APG 540 may generate independent traffic streams that are each directed to a different respective one of the first pseudo-channel 570 and the second pseudo-channel 580 of the memory device 504. For example, the first APG 530 may generate write data signaling (e.g., write data and write data strobe signals) and command/address signaling (e.g., a clock signal, a clock enable signal, and/or row and column address/command signals) directed to the first pseudo-channel 570.

The second APG 540 may generate write data signaling (e.g., write data and write data strobe signals) and command/address signaling (e.g., a clock signal, a clock enable signal, and/or row and column address/command signals) directed to the second pseudo-channel 580. The command/address signaling from each of the first APG 530 and the second APG 540 may be provided to the arbiter circuit 550. The write data signaling from the first APG 530 may be provided to the first pseudo-channel 570 via the data bus 592. The write data signaling from the second APG 540 may be provided to the second pseudo-channel 580 via the data bus 594. Each of the first APG 530 and the second APG 540 may further receive read data signaling (e.g., read data and/or read data strobe signals) via the data bus 592 and the data bus 594, respectively. That is, the data bus 592 and the data bus 594 may each include independent signal lines that correspond to the first pseudo-channel 570 and the second pseudo-channel 580, respectively. The data bus 592 and the data bus 594 may each include respective DQ lines for the data, WDQS signal lines for write data strobe signals, and RDQS signal lines for read data strobe signals. However, the command/address signaling for each pseudo-channel is shared using common signal lines of the command/address bus 596, such as CLK signal lines for a clock signal, a CKE signal line for a clock enable signal, and command/address signal lines for row and column command/address signals. To prevent collisions on the command/address bus 596, the arbiter circuit 550 may control provision of the command/address signals from the first APG 530 and the second APG 540 to the memory device 504 via the data bus 594. The DQ lines, WDQS signal lines, and RDQS signal lines of the data bus 592 and the data bus 594 that correspond to the first pseudo-channel 570 and the second pseudo-channel 580, respectively, may be coupled directly to the associated first APG 530 or the second APG 540. The arbiter circuit 550 may use a predefined pattern or order for command/address signal transmission from the first APG 530 and the second APG 540 via the command/address bus 596. For example, the arbiter circuit 550 may use a round-robin pattern to alternate between the first APG 530 and the second APG 540 to provide corresponding command/address signals. In some examples, the command/address signal transmissions from one of the first APG 530 or the second APG 540 may be split and transmitted across two consecutive clock cycles. The arbiter circuit 550 may include logic to allow consecutive command/address signal transmissions from one of the first APG 530 or the second APG 540 prior to moving to the other of the first APG 530 or the second APG 540. The arbiter circuit 550 may provide a Stall APG2 signal to the second APG 540 when the first APG 530 is providing consecutive command/address signal transmissions and provide a Stall APG1 signal to the first APG 330 when the second APG 340 is providing consecutive command/address signal transmissions. While the Stall AGP1 signal is set, the first APG 530 may pause provision of respective request packets. While the Stall AGP2 signal is set the second APG 340 may pause provision of respective request packets The test interface circuit 520 that includes the first APG 530 and the second APG 540 to generate two independent traffic streams to emulate different traffic streams from multiple cores of a processor (e.g., the processor(s) 110) and the arbiter circuit 550 to merge the two independent traffic streams for communication with the memory device 504 may provide more robust and simplified test platform for testing the memory device 504 as compared with software solutions that are time-consuming, complex, and error-prone. That is, because each of the first APG 530 and the second APG 540 is independent, simple data/command/address patterns may be written within each of the first APG 530 and the second APG 540, combining the two independent traffic streams, each with their own looping sequences and command timings, may result in walking of the multiple, independent traffic streams past each other and generate a large set of random command sequences without having to program complex patterns. The test interface circuit 520 may be part of a BIST engine in a host device, or may be included in a standalone, external test circuit or test ASIC, in some examples. In other examples, the test interface circuit 520 may be part of a BIST engine included in the memory device 504 without departing from the scope of the disclosure.

Figure 6:
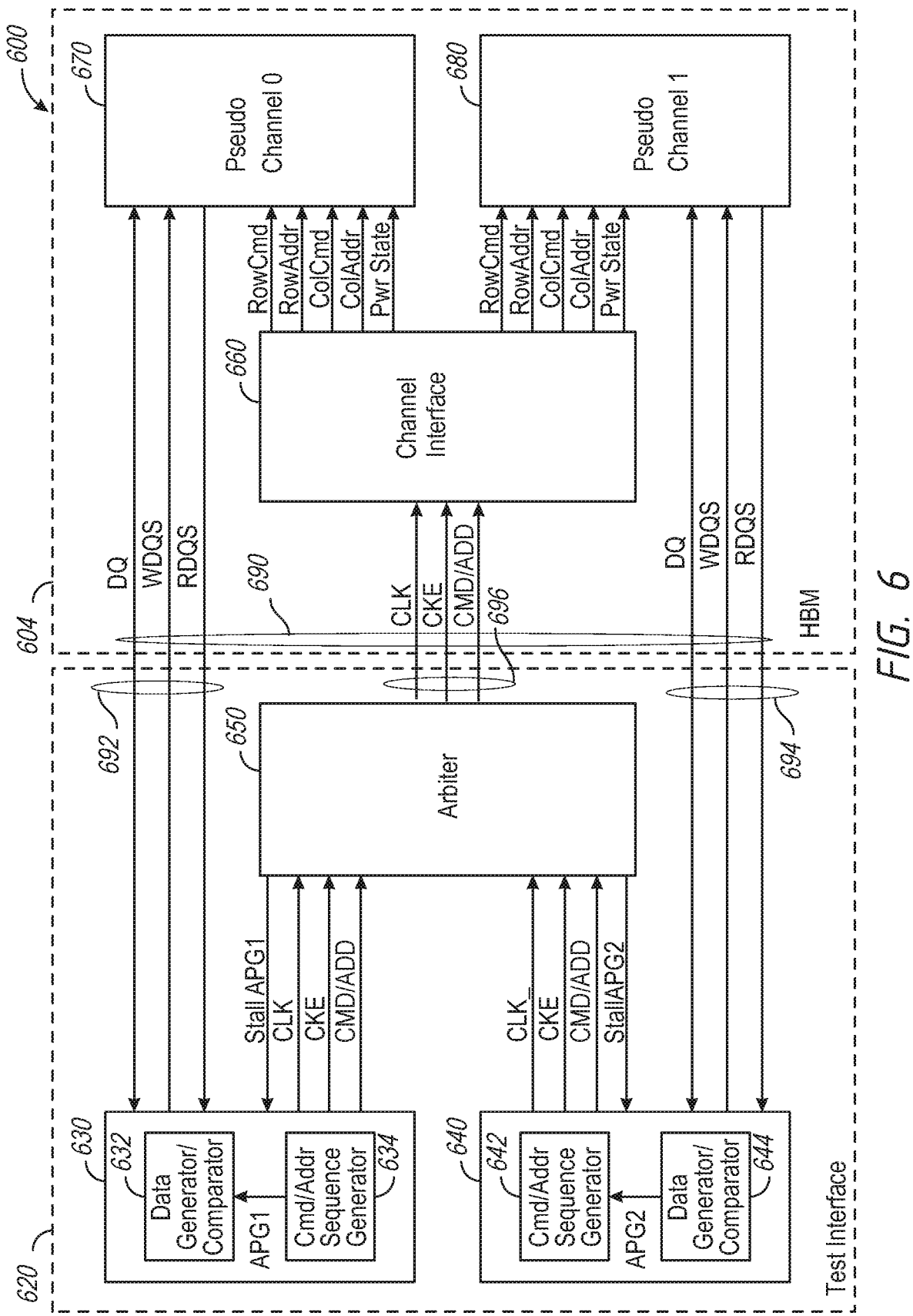
FIG. 6 is a block diagram of a computing system that includes a test interface circuit and a memory device in accordance with some embodiments of the disclosure.

FIG. 6 is a block diagram of a computing system 600 that includes a test interface circuit 620 and a memory device 604 in accordance with some embodiments of the disclosure. The test interface circuit 620 may be implemented in the test interface circuit 120 of FIG. 1 and/or the test interface circuit 520 of FIG. 5. The memory device 604 may be implemented in the memory device 104 of FIG. 1 and/or the memory device 504 of FIG. 5.

The test interface circuit 620 may communicate with the memory device 604 via a communication bus 690 The test interface circuit 620 may include a first APG 630, a second APG 640, and an arbiter circuit 650. To test operation of the memory device 604, the test interface circuit 620 may be configured to generate multiple, independent traffic streams using the first APG 630 and the second APG 640. The first APG 630 may be configured to provide data to the memory device 604 via a data bus 692 of the communication bus 690. The second APG 640 may be configured to provide data to the memory device 604 via a data bus 694 of the communication bus 690. The first APG 630 and the second APG 640 may be configured to provide respective command and address data to the arbiter circuit 650, which may be configured to arbitrate provision of the respective command and address data for communication over a command/address bus 696 of the communication bus 690.

The first APG 630 may include a data generator/comparator 632 that is configured to generate write data to provide to the memory device 604 via the data bus 692 and to compare read data received via the data bus 692 with expected data. The data bus 692 may include data DQ signal lines, write data strobe WDQS signal lines, and read data strobe RDQS signal lines. The first APG 630 may further include a command/address generator 634 that is configured to generate command and address CMD/ADD sequences, clock signals CLK, and clock enable signals CKE associated with the write and read data. The second APG 640 may include a data generator/comparator 642 that is configured to generate write data to provide to the memory device 604 via the data bus 694 and to compare read data received via the data bus 694 with expected data. The data bus 694 may include data DQ signal lines, write data strobe WDQS signal lines, and read data strobe RDQS signal lines. The second APG 640 may further include a command/address generator 644 that is configured to generate command and address CMD/ADD sequences (e.g., row and column address and command signals), clock signals CLK, and clock enable signals CKE associated with the write and read data. The arbiter circuit 650 may be configured to selectively provide the CMD/ADD sequences, the CLK signals, the CKE signals associated with the write and read data from one of the first APG 630 or the second APG 640. In some examples, the arbiter circuit 650 may also provide a first stall signal Stall APG1 to the first APG 630 when consecutive command/address signals are to be transmitted from the second APG 640. Similarly, the arbiter circuit 650 may also provide a second stall signal Stall APG2 to the second APG 640 when consecutive command/address signals are to be transmitted from the first APG 630. While the Stall AGP1 signal is set, the command/address generator 634 may pause provision of respective command/address signals. While the Stall AGP2 signal is set, the command/address generator 644 may pause provision of respective command/address signals.

The memory device 604 may include a high-performance random access memory interface and vertically stacked DRAM die. In some examples, the FIRM may include multiple (e.g., 4, 8, 16, etc.) DRAM die and multiple (e.g., 4, 8, 16, etc.) pseudo-channels, including the first pseudo-channel 670 and the second pseudo-channel 680, each having multiple (e.g., 32, 64, 128, 256, etc.) I/Os. The memory device 604 may further include an interface (I/F) die having a channel interface circuit 660 that is configured to provide an interface with the multiple input/output channels, including the first pseudo-channel 670 and the second pseudo-channel 680. The first pseudo-channel 670 and the second pseudo-channel 680 may each be capable of functioning semi-independently (e.g., sharing the command/address bus 696) of one another. Thus, the channel interface circuit 660 may provide independent row command RowCmd signals, row address signals RowAddr, column command ColCmd signals, column address signals ColAddr. For example, a command sequence and data may be independently provided for each of the first pseudo-channel 670 and the second pseudo-channel 680.

During a test operation, the test interface circuit 620 may be configured to generate two independent traffic streams via the first APG 630 and the second APG 640. Each of the first APG 630 (e.g., the data generator/comparator 632 and the command/address generator 634) and the second APG 640 (e.g., the data generator/comparator 642 and the command/address generator 644) may be programmed with independent data/command/address patterns, looping sequences, and command timings. The outputs of the first APG 630 and the second APG 640 may be provided to the data bus 692, the data bus 694, and the arbiter circuit 650, respectively. The arbiter circuit 650 may be configured to merge CMD/ADD signals, the CLK signals, and the CKE signals from the first APG 630 and the second APG 640 to provide the respective CMD/ADD signals, the CLK signals, and the CKE to the memory device 604 via the command/address bus 696 in accordance with a specified communication architecture. Generation of the multiple, independent traffic streams may emulate multiple cores of a processor each independently executing different processing threads, in some examples.

The first APG 630 and the second APG 640 may generate independent traffic streams that are each directed to a different respective one of the first pseudo-channel 670 and the second pseudo-channel 680 of the memory device 604. For example, the data generator/comparator 632 may generate write data signaling (e.g., DQ and WDQS signals) and the command/address generator 634 may generate command/address signaling (e.g., the CMD/ADD signals, the CLK signals, and the CKE signals) directed to the first pseudo-channel 670. The data generator/comparator 642 may generate write data signaling (e.g., DQ and WDQS signals) and the command/address generator 644 may generate command/address signaling (e.g., the CMD/ADD signals, the CLK signals, and the CKE signals) directed to the second pseudo-channel 680. The command/address signaling from each of the command/address generator 634 and the command/address generator 644 may be provided to the arbiter circuit 650. The write data signaling from the data generator/comparator 632 may be provided to the first pseudo-channel 670 via the data bus 692. The write data signaling from the data generator/comparator 642 may be provided to the second pseudo-channel 680 via the data bus 694. Each of the data generator/comparator 632 and the command/address generator 644 may further receive read data signaling (e.g., DQ and/or RDQS signals) via the data bus 692 and the data bus 694, respectively. That is, the data bus 692 and the data bus 694 may each include independent signal lines that correspond to the first pseudo-channel 670 and the second pseudo-channel 680, respectively. The data bus 692 and the data bus 694 may each include respective DQ lines for the data, WDQS signal lines for write data strobe signals, and RDQS signal lines for read data strobe signals. However, the command/address signaling for each pseudo-channel is shared using common signal lines of the command/address bus 696, such as CLK signal lines, CKE signal lines, and CMD/ADD signal lines for row and column command/address signals. To prevent command/address signal collisions or clobbering, the arbiter circuit 650 may control provision of the command/address signals from the first APG 630 and the second APG 640 to the memory device 604 via the data bus 694. The DQ lines, WDQS signal lines, and RDQS signal lines of the data bus 692 and the data bus 694 that correspond to the first pseudo-channel 670 and the second pseudo-channel 680, respectively, may be coupled directly to the associated first APG 630 or the second APG 640. The arbiter circuit 650 may use a predefined pattern or order for command/address signal transmission from the first APG 630 and the second APG 640 via the command/address bus 696. For example, the arbiter circuit 650 may use a round-robin pattern to alternate between the first APG 630 and the second APG 640 to provide corresponding command/address signals. In some examples, the command/address signal transmissions from one of the first APG 630 or the second APG 640 may be split and transmitted across two consecutive dock cycles, such as an in the case of an activate command. The arbiter circuit 650 may include logic to allow consecutive command/address signal transmissions from one of the first APG 630 or the second APG 640 prior to moving to the other of the first APG 630 or the second APG 640.

The channel interface circuit 660 may be configured to decode the CMD/ADD signals based on the CLK and the CKE signals received from the command/address bus 696 to determine a target one of the first pseudo-channel 670 or the second pseudo-channel 680. The channel interface circuit 660 may provide the RowCmd signals, RowAddr, ColCmd signals, and ColAddr to one of the first pseudo-channel 670 or the second pseudo-channel 680 based on the decoded signals received from the command/address bus 696.

The test interface circuit 620 that includes the first APG 630 and the second APG 640 to generate two independent traffic streams to emulate different traffic streams from multiple cores of a processor (e.g., the processor(s) 110) and the arbiter circuit 650 to merge the two independent traffic streams for communication with the memory device 604 may provide more robust and simplified test platform for testing the memory device 604 as compared with software solutions that are time-consuming, complex, and error-prone. That is, because each of the first APG 630 and the second APG 640 is independent, simple data/command/address patterns may be written within each of the first APG 630 and the second APG 640, combining the two independent traffic streams, each with their own looping sequences and command timings, may result in walking of the multiple, independent traffic streams past each other and generate a large set of random command sequences without having to program complex patterns. The test interface circuit 620 may be part of a BIST engine in a host device, or may be included in a standalone, external test circuit or test ASIC, in some examples. In other examples, the test interface circuit 620 may be part of a BIST engine included in the memory device 604 without departing from the scope of the disclosure.

Figure 7:
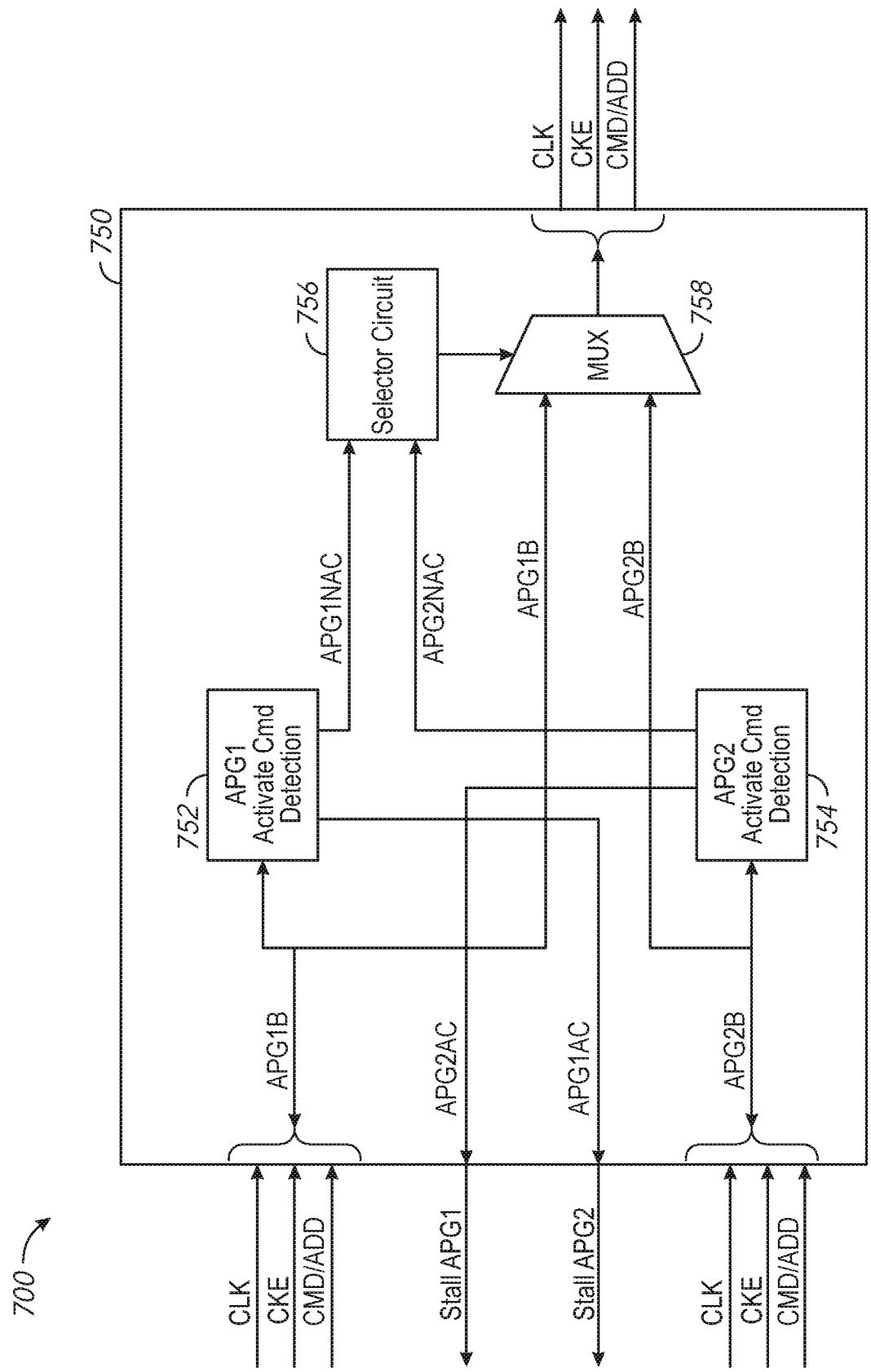
FIG. 7 is a block diagram of a computing system that includes an arbiter circuit in accordance with some embodiments of the disclosure.

FIG. 7 is a block diagram of a computing system 700 that includes an arbiter circuit 750 in accordance with some embodiments of the disclosure. The arbiter circuit 750 may be implemented in the test interface circuit 120 of FIG. 1, the arbiter circuit 550 of FIG. 5, and/or the arbiter circuit 650 of FIG. 6. The arbiter circuit 750 may be configured to communicate with a first and a second APG (e.g., the first APG 530 and the second APG 540 of FIG. 5 or the first APG 630 and the second APG 640 of FIG. 6) and with a HBM via a communication bus (e.g., the HBM link 590 of FIG. 5 or the HBM link 690 of FIG. 6.

The arbiter circuit 750 may include a first APG activate command detector 752, a second APG activate command detector 754, a selector circuit 756, and a multiplexer 758. The first APG activate command detector 752 may be configured to receive command/address signals (e.g., CLK, CKE, and CMD/ADD signals) from a first APG via a first APG bus AGP1B. The first APG activate command detector 752 may decode the command/address signals to detect an activate command. In response to an activate command, the first APG activate command detector 752 may provide an APG1 activate command signal APG1AC to the selector circuit 756. In response to lack of detection of an activate command, the first APG activate command detector 752 may provide an APG1 no activate command signal APG1NAC to the selector circuit 756. Thus, the first APG activate command detector 752 may hold the APG1NAC signal at a cleared value and the APG1AC signal to a set value when an activate command is detected to allow consecutive address/command signaling to be transmitted from the first APG. The APG1AC may be provided to the second APG as the Stall AGP2 signal. In response to the Stall APG2 signal being set, the second APG may pause provision of respective address/command signaling.

The second APG activate command detector 754 may be configured to receive command/address signals (e.g., CLK, CKE, and CMD/ADD signals) from a second APG via a second APG bus AGP2B. The second APG activate command detector 754 may decode the command/address signals to detect an activate command. In response to an activate command, the second APG activate command detector 754 may provide an APG2 activate command signal APG2AC to the selector circuit 756. In response to lack of detection of an activate command, the second. APG activate command detector 754 may provide an APG2 no activate command signal APG2NAC to the selector circuit 756. Thus, the second APG activate command detector 754 may hold the APG2NAC signal at a cleared value and the APG2AC signal to a set value when an activate command is detected to allow consecutive address/command signaling to be transmitted from the second APG. The APG2AC may be provided to the first APG as the Stall AGP1 signal. In response to the Stall APG1 signal being set, the second APG may pause provision of respective address/command signaling.

The multiplexer 758 may be configured to receive the command/address signals from the APG1B bus and from the APG2B bus. The selector circuit 756 may control the multiplexer 758 to couple one of the APG1B or the APG2B to the command/address signal bus based on the APG1NAC and APG2PNAC signals. For example, the selector circuit 756 may transition from selection of the APG2B bus to selection of the APG1B bus in response the APG2NAC signal being set. The selector circuit 756 may transition from selection of the APG1B bus to selection of the APG2B bus in response the APG1NAC signal being set.

When the APG1B bus is selected, the multiplexer 758 may be configured to provide command/address signals from the APG1B bus to an output command/address signal bus. When the APG2B bus is selected, the multiplexer 758 may be configured to provide command/address signals from the APG2B bus to an output command/address signal bus.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a test interface circuit configured to communicate with a shared interface of a memory device; wherein the test interface circuit is configured to generate a plurality of independent traffic streams and to provide the plurality of independent traffic streams to the shared memory interface used to communicate with the memory device, wherein each of the plurality of independent traffic streams is directed to different semi-independently-accessible portion of the memory device, wherein each of the plurality of independent traffic streams is generated by a respective algorithmic pattern generator (APG), wherein the test interface circuit comprises an arbiter circuit configured to receive the plurality of independent traffic streams and to merge the plurality of independent traffic streams to the shared memory interface based on a specified communication architecture associated with the shared memory interface, wherein the arbiter circuit comprises:
   a plurality of decoder circuits, wherein a decoder circuit of the plurality of decoder circuits is configured to decode a respective one of the plurality of independent traffic streams and to provide respective first control signals and respective second control signals based on the decoded respective one of the plurality of independent traffic streams, wherein the respective second control signals are provided to the respective APG associated with the plurality of independent traffic streams other than the respective one of the plurality of independent traffic streams;
   a multiplexer circuit configured to merge the plurality of independent traffic streams based on a third control signal; and
   a selector circuit configured to provide the third control signal having a value based on the respective first control signals from the plurality of decoder circuits.

2. The apparatus of claim 1, wherein the memory device is a hybrid memory cube (HMC) and the shared memory interface is a HMC link, wherein a first independent traffic stream of the plurality of independent traffic streams is directed to a first vault of the HMC and a second independent traffic stream of the plurality of independent traffic streams is directed to a second vault of the HMC.

3. The apparatus of claim 2, wherein the first independent traffic stream includes first request packets having at least one of command information, address information, or data directed to the first vault, and wherein the second independent traffic stream includes second request packets having at least one of command information, address information, or data directed to the second vault.

4. The apparatus of claim 3, wherein the multiplexer is configured to selectively provide response packets to the respective APG associated with one of the plurality of independent traffic streams.

5. The apparatus of claim 3, wherein the decoder circuit of the plurality of decoder circuits is configured to provide the respective second control signals having a value that causes the plurality of independent traffic streams other than the respective one of the plurality of independent traffic streams to pause in response to receiving a request packet indicating multiple consecutive request packet transmissions.

6. The apparatus of claim 1, wherein the memory device is a high bandwidth memory (HBM) device and the shared memory interface is a shared command and address bus, wherein a first independent traffic stream of the plurality of independent traffic streams is directed to a first pseudo-channel of the HBM device and a second independent traffic stream of the plurality of independent traffic streams is directed to a pseudo-second channel of the HBM device.

7. The apparatus of claim 6, wherein the first independent traffic stream includes at least one of command information, address information, or write data directed to the first channel, and wherein the second independent traffic stream includes command information, address information, or write data directed to the second channel.

8. The apparatus of claim 7, wherein a first APG associated with the first independent traffic stream is configured to receive read data and to provide write data via a first data bus, and wherein a second APG associated with the second independent traffic stream is configured to receive read data and to provide write data via a second data bus.

9. The apparatus of claim 8, wherein the first data bus include first data signal lines, first write data strobe signal lines, and first read data strobe signal lines, and wherein the second data bus include second data signal lines, second write data strobe signal lines, and second read data strobe signal lines.

10. The apparatus of claim 6, wherein the decoder circuit of the plurality of decoder circuits is configured to provide the respective second control signals having a value that causes the plurality of independent traffic streams other than the respective one of the plurality of independent traffic streams to pause in response to receiving a command indicating multiple consecutive command transmissions.

11. The apparatus of claim 1, wherein the test interface circuit is included in the built-in self-test (BEST') engine.

12. The apparatus of claim 11, wherein the BIST engine is included in the memory device.

13. An apparatus comprising:
a test interface circuit comprising:
a first algorithmic pattern generator (APG) configured to generate a first independent traffic stream directed to a first semi-independently-accessible portion of a memory device;
a second APG configured to generate a second independent traffic stream directed to a second semi-independently-accessible portion of the memory device; and
an arbiter circuit configured to merge the first independent traffic stream and the second independent traffic stream for communication to the memory device via a shared memory interface, wherein the memory device is a high bandwidth memory (HBM) device and the shared memory interface is a shared command and address bus, wherein the first independent traffic stream is directed to a first pseudo-channel of the HBM device and the second independent traffic stream is directed to a second pseudo-channel of the HBM device, wherein the arbiter circuit comprises:
a first decoder circuit configured to detect an activate command in the first independent traffic stream to provide a first control signal and a second control signal based on detection of the activate command, wherein the second APG pauses generation of the second independent traffic stream based on the second control signal having a value indicating detection of the activate command in the first independent traffic stream;
a second decoder circuit configured to detect an activate command in the second independent traffic stream to provide a third control signal and a fourth control signal based on detection of the activate command, wherein the first APG pauses generation of the first independent traffic stream based on the fourth control signal having a value indicating detection of the activate command in the second independent traffic stream,
a multiplexer circuit configured to selectively provide command and address data associated with one of the first independent traffic stream or the second independent traffic stream to the shared command and address bus based on a fifth control signal; and
a selector circuit configured to provide the fifth control signal having a value based on the first control signal and the third control signal.

14. An apparatus comprising:
a test interface circuit comprising:
a first algorithmic pattern generator (APG) configured to generate a first independent traffic stream directed to a first semi-independently-accessible portion of a memory device;
a second APG configured to generate a second independent traffic stream directed to a second semi-independently-accessible portion of the memory device; and
an arbiter circuit configured to merge the first independent traffic stream and the second independent traffic stream for communication to the memory device via a shared memory interface, wherein the memory device is a hybrid memory cube (HMC) and the shared memory interface is a HMC link, wherein the first independent traffic stream includes request packets directed to a first vault of the HMC and the second independent traffic stream includes request packets directed to a second vault of the HMC, wherein the arbiter circuit comprises:
a first decoder circuit configured to decode request packets of the first independent traffic stream to provide a first control signal and a second control signal based on the decode of the first independent traffic stream, wherein the second APG pauses generation of the second independent traffic stream based on the second control signal having a value indicating a multiple request packet transmissions from the first APG;

a second decoder circuit configured to decode request packets of the second independent traffic stream to provide a third control signal and a fourth control signal based on the decode of the second independent traffic stream, wherein the first APG pauses generation of the first independent traffic stream based on the fourth control signal having a value indicating a multiple request packet transmissions from the second APG;

a multiplexer circuit configured to selectively coupled one of the first APG or the second APG to the HMC link based on a fifth control signal; and a selector circuit configured to provide the fifth control signal having a value based on the first control signal and the third control signal.

* * * * *